(12) United States Patent
Elenius et al.

(10) Patent No.: US 6,287,893 B1
(45) Date of Patent: Sep. 11, 2001

(54) METHOD FOR FORMING CHIP SCALE PACKAGE

(75) Inventors: Peter Elenius; Harry Hollack, both of Scottsdale, AZ (US)

(73) Assignee: Flip Chip Technologies, L.L.C., Phoenix, AZ (US)

( * ) Notice: Subject to any disclaimer, the term of this patent is extended or adjusted under 35 U.S.C. 154(b) by 0 days.

(21) Appl. No.: 09/114,204

(22) Filed: Jul. 13, 1998

Related U.S. Application Data

(62) Division of application No. 08/954,426, filed on Oct. 20, 1997.

(51) Int. Cl.[7] .......................... H01L 21/44; H01L 21/48; H01L 21/50; H01L 21/4763; H01L 23/48
(52) U.S. Cl. .......................... 438/108; 438/613; 438/616; 438/618; 257/738; 257/778; 257/780
(58) Field of Search .................... 438/108, 613, 438/616; 257/778

(56) References Cited

U.S. PATENT DOCUMENTS

| | | | |
|---|---|---|---|
| 4,462,534 | 7/1984 | Bitaillou et al. | 228/180 |
| 5,024,372 | 6/1991 | Altman . | |
| 5,220,200 | 6/1993 | Blanton . | |
| 5,261,593 | 11/1993 | Casson et al. . | |
| 5,293,067 | 3/1994 | Thompson et al. . | |
| 5,346,861 | 9/1994 | Khandros et al. . | |
| 5,388,327 | 2/1995 | Trabucco | 29/830 |
| 5,455,390 | 10/1995 | DiStefano et al. . | |
| 5,504,277 | 4/1996 | Danner | 174/261 |
| 5,539,153 | 7/1996 | Schwiebert et al. . | |
| 5,541,450 | 7/1996 | Jones et al. | 257/697 |
| 5,547,740 | 8/1996 | Higdon et al. . | |
| 5,564,617 | 10/1996 | Degani et al. . | |
| 5,604,379 | 2/1997 | Mori | 257/738 |
| 5,608,262 | 3/1997 | Degani et al. . | |
| 5,701,032 | 12/1997 | Fischer et al. | 257/692 |
| 5,736,456 | 4/1998 | Akram | 438/614 |
| 5,777,391 | * 7/1998 | Nakamura | 257/778 |
| 5,814,894 | 9/1998 | Igarashi et al. | 257/787 |

FOREIGN PATENT DOCUMENTS 0 655 779 A1   5/1994  (EP) .

OTHER PUBLICATIONS

Chanchani, et al., "A New mini Ball Grid Array (mBGA) Multichip Module Technology", The International Journal of Microcircuits and Electronic Packaging, vol. 18, No. 3, 1995, pp. 185–192.

P. Marcoux, "A Minimal Packaging Solution For Known Good Die And Direct Chip Attachment", SMI Conf., San Jose, California, Aug. 1994, pp. 19–26.

A. Badihi, et al., "Shellcase—A True Miniature Integrated Circuit Package", Proc. Intl. FC, BGA, AP Symp., San Jose, California, Feb. 1995, pp. 244–252.

Harper, "Electronic Packaging and Interconnection Handbook", McGraw–Hill, p 5.5, 1991.

Doane, et al., "Multichip Module Technologies and Alternatives: The Basics", Van Nostrand Reinhold, pp 325, 346, 1993.

* cited by examiner

Primary Examiner—Charles Bowers
Assistant Examiner—Nema Berezny
(74) Attorney, Agent, or Firm—Cahill, Sutton & Thomas, P.L.C.

(57) ABSTRACT

A chip scale package design for a flip chip integrated circuit includes a redistribution metal layer upon the upper surface of a semiconductor wafer for simultaneously forming solder bump pads as well as the metal redistribution traces that electrically couple such solder bump pads with the conductive bond pads of the underlying integrated circuit. A patterned passivation layer is applied over the redistribution metal layer. Relatively large, ductile solder balls are placed on the solder bump pads for mounting the chip scale package to a circuit board or other substrate without the need for an underfill material. The back side of the semiconductor wafer can be protected by a coating for mechanical strength during handling. A method of forming such a chip scale package at the wafer processing level is also disclosed.

2 Claims, 2 Drawing Sheets

METHOD FOR FORMING CHIP SCALE PACKAGE

CROSS-REFERENCE TO RELATED APPLICATION

This application is a divisional, pursuant to 37 C.F.R. §1.53(b), of parent application Ser. No. 08/954,426, filed on Oct. 20, 1997 and entitled "CHIP SCALE PACKAGE USING LARGE DUCTILE SOLDER BALLS", and the benefit of such earlier filing date is hereby asserted pursuant to 35 U.S.C. §120.

BACKGROUND OF THE INVENTION

1. Field of the Invention

The present invention relates generally to flip chip mounting of integrated circuits to circuit boards or other mounting substrates via solder bumps, and more particularly, to a chip scale package and related method for allowing integrated circuits to be directly connected to an underlying circuit board or other substrate.

2. Description of the Related Art

Flip chips are conventionally understood by those skilled in the art to designate unpackaged integrated circuit chips that have contact pads bearing solder bumps for attachment to a patterned substrate. Such flip chips are formed from integrated circuit die that are scribed from a semiconductor wafer. During processing, such semiconductor wafer has an upper active surface through which impurities are introduced, by chemical diffusion and/or implantation, to form individual transistors and other electronic components. Metallization layers are also patterned upon the upper, or active, surface of such semiconductor wafer to electrically interconnect the electrodes of the various devices formed in such semiconductor wafer. For flip chips, the upper active surface of scribed integrated circuit die are inverted, or flipped, in order to be solder connected to an underlying patterned substrate. Heating of the solder bumps to their "reflow" temperature melts the solder, and the "reflow" of the solder joins the flip chip electrically and mechanically with the underlying patterned support substrate. The use of solder bumps to interconnect such flip chips to underlying support substrates is disclosed, for example, within U.S. Pat. No. 5,261,593 to Casson, et al.; within U.S. Pat. No. 5,220,200 to Blanton; within U.S. Pat. No. 5,547,740 to Higdon, et al.; and within U.S. Pat. No. 5,564,617 to Degani, et al.

Unpackaged integrated circuits are essentially bare semiconductor die, and are subject to damage if mishandled during assembly. Accordingly, many manufacturers of electronic equipment are reluctant to directly attach unpackaged flip chips to circuit boards, and many of such manufacturers desire devices that are "packaged". Consequently, many integrated circuit suppliers have elected to "package" integrated circuits in a so-called "chip scale packages" to overcome customer concerns about handling bare die. A "chip scale package" typically designates a package that is no more than 20 percent larger than the integrated circuit die itself Such chip scale packages provide a minimal degree of mechanical protection to the integrated circuit die and allow it to be handled more easily; customers tend to derive a sense of security knowing that they are not handling bare die. Such chip scale packages typically join the active surface of the integrated circuit to a somewhat larger substrate; electrical contacts provided on the substrate are then used to interconnect the chip scale package to the circuit board.

Often, the supporting substrate of a flip chip assembly and the associated integrated circuit will have different coefficients of thermal expansion. Such thermal stresses can fracture the solder bumps used to join the flip chip integrated circuit to the supporting substrate, causing the circuitry to fail. It is known to those in the flip chip packaging field to utilize an underfill material around the solder bumps, and between the integrated circuit and the supporting substrate, to constrain thermal expansion differences between the chip and the substrate. While the use of such underfill material serves to improves the fatigue life of the solder joints, the application of this underfill is often perceived as an expensive process that is not consistent with standard surface mount technology manufacturing processes.

Standard flip chip solder joints are typically very small (i.e., 100 micron diameter with a joined height of 70–85 microns). To be compatible with standard surface mount technology processes, the typical solder joint is composed of a 63 Sn/Pb solder, i.e., the solder bump is composed of 63% tin and 37% lead. In one known technology, 63 Sn/Pb solder is deposited onto a substrate's solder contact pads, and high percentage Pb solder bumps are evaporated or plated onto the flip chip bond pads of the integrated circuit; however, the size of such solder bumps was typically less than 7 mils (.007 inch). The small solder joint, and the fatigue characteristics of these flip chip solder joints, mandate the use of an underfill to minimize the strain on the solder bumps.

Many known chip scale package processes use solder bumps to join the bonding pads of the integrated circuit to the supporting substrate. These bonding pads are typically located at the outer perimeter of the integrated circuit chip. Complex integrated circuits often require in excess of one-hundred separate bonding pads in order to make the necessary power, input, and output connections between the integrated circuit and the outside world. Consequently, such bonding pads are typically disposed close to each other and place physical limitations upon the size and height of solder bumps overlying such bonding pads. While U.S. Pat. No. 5,547,740 to Higdon, et al. discloses that some of the solder bump contact pads can be redistributed internally, away from the outer perimeter of the integrated circuit, the size of such solder bumps is unchanged.

Moreover, most of the known techniques for forming chip scale packaging of integrated circuits must be practiced at the individual die level; i.e., the semiconductor wafer from which the integrated circuits are taken must first be scribed and cut into individual die before such chip scale packaging processes can be performed. These die level packaging techniques do not obtain the cost benefits of the wafer scale processing techniques. Moreover, certain integrated circuit markets, such as memory chips, are largely driven by form factor (i.e., the physical size of the packaged integrated circuit) and the cost of packaging. Yet, many of the known chip scale package techniques involve significant added cost and increase the dimensions of the packaged integrated circuit.

One of the known wafer level processing technologies used to form chip scale packages is the Mitsubishi PMEB (Plastic Molded, Extended Bump) technique; the PMEB package from Mitsubishi utilizes a redistribution technology to move solder bump pads away from the bond pads of the integrated circuit, and also performs initial solder bumping at the wafer level; however, following these steps, the Mitsubishi PMEB technique dices the components from the semiconductor wafer, encapsulates them, and then places a eutectic "extended bump" onto the surface of the package. The resulting chip scale package construction is sensitive to moisture ingress and has a relatively high cost at low lead counts. In addition, the Mitsubishi PMEB package uses a 63

Sn/Pb extended solder bump (the plastic encapsulant precludes a higher solder reflow temperature) which limits the fatigue life of the extended solder bumps.

Another known wafer level technology used to form chip scale packages is the Sandia Mini Ball Grid Array technique redistributes the locations of the solder bump locations on the integrated circuit, but requires multiple metal layers because a plating process is used for solder deposition. The redistribution wiring is provided by a first layer of deposited metal that is patterned and passivated. A second layer of metal is then sputtered over the wafer to form the solder bump pads, and standard electroplating processes are used for forming standard-sized solder bumps.

Accordingly, it is an object of the present invention to provide an improved chip scale package, and a method of forming such an improved chip scale package, for flip chip integrated circuits which is consistent with standard surface mount technology manufacturing processes, and which avoids the need to add an underfill material between the integrated circuit and a supporting substrate in order to protect the solder bumps from fatigue induced by thermal coefficient differentials.

It is another object of the present invention to provide an improved chip scale package, and method for forming the same, which can be carried out at the wafer processing level, as opposed to the discrete integrated circuit die level.

Still another object of the present invention is to provide an improved chip scale package for an integrated circuit, and method for forming the same, which is relatively inexpensive to implement, and which results in a small form factor, i.e., the resulting chip scale package is not larger than the size of the original integrated circuit.

A further object of the present invention is to provide a wafer scale chip scale package which can be directly surface mounted, yet which are better protected, and easier to handle, than bare flip chip integrated circuit die.

A still further object of the present invention is to provide a wafer scale chip scale package that can be directly surface mounted to supporting substrates via solder bumping and wherein the susceptibility of such solder bumps to fatigue is reduced.

Yet another object of the present invention is to provide such a wafer scale chip scale package which minimizes the number of metallization layers applied over the integrated circuit die to facilitate solder bumping, and which permits the formation of solder bumps by processes other than plating.

These and other objects of the present invention will become more apparent to those skilled in the art as the description of the present invention proceeds.

SUMMARY OF THE INVENTION

Briefly described, and in accordance with a preferred embodiment thereof, the present invention relates to a chip scale package that includes an integrated circuit formed upon a semiconductor die having a front surface and an opposing rear surface. A group of conductive bond pads are formed upon the front surface of the integrated circuit die proximate the outer periphery thereof for making electrical interconnections to the devices formed within the integrated circuit. A patterned metal layer is formed over the front surface of the semiconductor die, defining a number of solder bump pads that are electrically coupled to the conductive bond pads of the integrated circuit die but laterally displaced from the outer periphery of the integrated circuit die. A passivation layer extends over the front surface of the semiconductor die and above the patterned metal layer; openings formed within such passivation layer expose the solder bump pads. A protective coating can extend over the rear surface of the semiconductor die for mechanical protection. Ductile solder balls, each being generally spherical and measuring at least 9 mils (.009 inch) in diameter, are formed upon each such solder pad for allowing the resulting structure to be directly surface mounted to a circuit board or other substrate.

In the preferred embodiment of the present invention, the aforementioned ductile solder balls consist of at least 80 percent lead (Pb) by weight. While such solder balls have a higher reflow temperature, they are also less subject to mechanical fatigue. Other ductile solder ball compositions may be used, including alloys of Indium (In).

Preferably, each of the solder bump pads is disposed upon the front surface of the semiconductor die closer to the center thereof than the corresponding conductive bond pad to which each such solder bump pad is electrically coupled. This arrangement permits the solder balls to be of larger diameter without risking that such solder balls will extend over the peripheral edge of the semiconductor die, and without risking that such solder balls will abut each other. The patterned metal layer provides a plurality of redistribution traces for electrically coupling the solder bump pads to their corresponding conductive bond pads; this patterned metal layer ideally consists of a single layer of metal that simultaneously provides both the solder bump pads as well as the redistribution traces. The aforementioned passivation layer is preferably a polymer, the compound Benzocyclobutene being preferred.

Another aspect of the present invention relates to a solder-bumped semiconductor wafer construction including a semiconductor wafer containing a plurality of like integrated circuits, each of the integrated circuits including a series of conductive bond pads formed about the outer periphery thereof upon the front surface of the semiconductor wafer for making electrical interconnections to each such integrated circuit. A patterned metal layer is formed over the front surface of the semiconductor wafer above each such integrated circuit for providing a series of solder bump pads and electrically coupling the conductive bond pads of each such integrated circuit to its corresponding series of solder bump pads. The front surface of the semiconductor wafer is protected by a passivation layer that extends over the front surface of the semiconductor wafer and above each of the patterned metal layers; openings are formed in the passivation layer above each of the solder bump pads. The rear surface of the semiconductor wafer can be protected by a protective coating formed thereupon. Ductile solder balls, each having a generally spherical shape and measuring at least 9 mils (0.009 inch) in diameter, are secured to each solder bump pad on each of the integrated circuits. The resulting semiconductor wafer can then be scribed and diced to provide a number of such integrated circuits in the form of chip scale integrated circuit packages.

The present invention also relates to a method of forming a chip scale package for a flip chip integrated circuit. According to such method, a semiconductor wafer is provided containing a number of like integrated circuits, each of such integrated circuits including a series of conductive bond pads formed upon the front surface of the semiconductor wafer and arranged about the periphery of each such integrated circuit for making electrical interconnections thereto. A protective coating can be applied over the rear surface of the semiconductor wafer. A layer of metal is applied over the front surface of the semiconductor wafer, and portions of such metal layer are then selectively removed to leave a patterned metal layer over each integrated circuit. Each of the patterned metal layers provides a series of solder bump pads upon the front surface of each such integrated circuit, each such solder bump pad being electrically coupled by such patterned metal layer to a corresponding one of the solder bump pads. A passivation layer is then applied over the front surface of the semiconductor wafer and above each of the patterned metal layers to seal the front surface of each of the integrated circuits, while leaving openings in the applied passivation layer above each of the solder bump pads. Ductile solder balls are then applied to each solder bump pad, each of the ductile solder balls having a generally spherical shape and measuring at least 9 mils (.009 inch) in diameter. The resulting semiconductor wafer is then diced to provide a number of integrated circuits in chip scale packaged form.

The passivation layer applied in the present method is preferably a polymer layer; the product Benzocyclobutene has been found to be particularly advantageous as such a polymer passivation layer.

In practicing the method of the present invention, the solder balls are caused to be highly ductile, preferably by selecting a solder ball composition consisting of at least 80 percent lead (Pb) by weight. Alternatively, a solder ball composition consisting of an alloy of Indium (In) may also be used. In the preferred embodiment of the present method, a ductile solder ball is provided above each solder bump pad by mechanically placing a pre-formed solder ball on each such solder bump pad. Solder flux is preferably applied to the solder bump pads prior to application of the ductile solder balls; the semiconductor wafer is then heated to the reflow temperature of the solder balls following application of the ductile solder balls to permanently secure the solder balls to the underlying solder bump pad.

In view of the relatively large size of such solder balls, the present method contemplates the redistribution of the solder pads away from the periphery of the integrated circuit to points located closer to the center of each integrated circuit, as compared with the original locations of the corresponding conductive bond pads of the integrated circuit. This relocation of the solder bump pads is accomplished by providing a series of redistribution traces during the step of selectively removing portions of the applied metal layer in order to electrically couple each solder bump pad to its corresponding conductive bond pad. In practicing this method, it is preferred that the same applied metal layer is patterned to form both the solder bump pads as well as the aforementioned redistribution traces.

DETAILED DESCRIPTION OF THE PREFERRED EMBODIMENT

Figure 1:
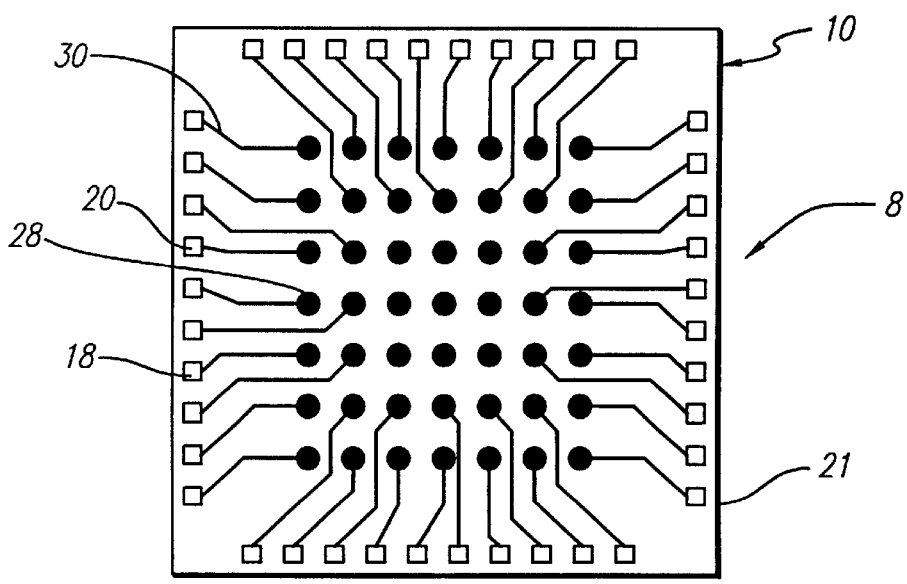
FIG. 1 is a top view of a chip scale packaged integrated circuit constructed in accordance with a preferred embodiment of the present invention.
Figure 2:
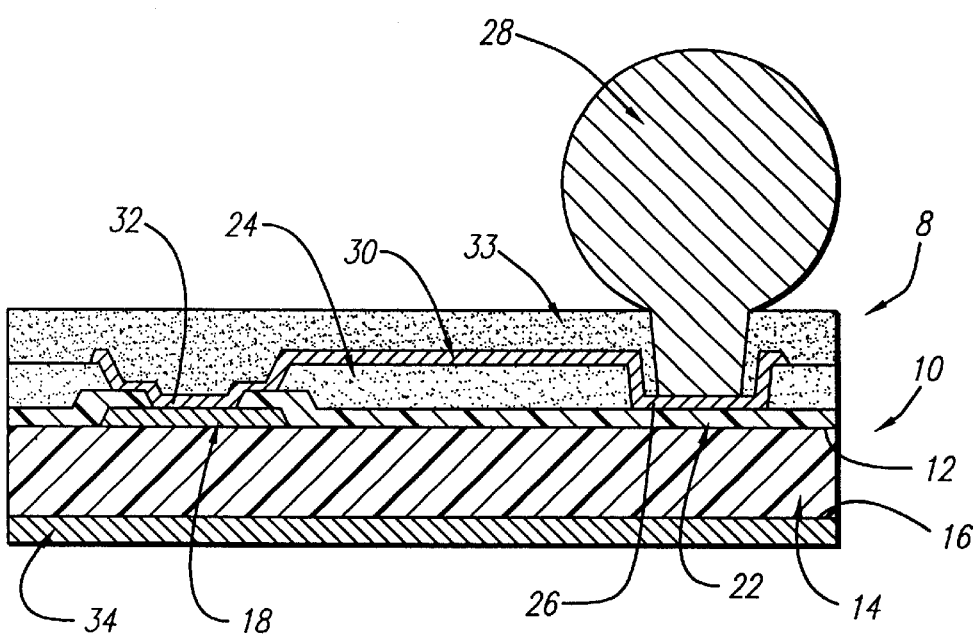
FIG. 2 is a cross-sectional view of a portion of a semiconductor wafer used to form the chip scale packaged integrated circuit shown in FIG. 1.

FIGS. 1 and 2 illustrate a chip scale package, designated generally by reference numeral 8, for a flip chip integrated circuit constructed in accordance with the present invention. Within FIG. 1, an integrated circuit 10 has been formed upon a semiconductor die in a conventional manner, and incorporates an interconnected network of transistors and other electrical components (not shown). Referring to FIG. 2, integrated circuit 10 is formed upon the front surface 12 of a semiconductor wafer 14, which also includes an opposing rear surface 16. Chemical impurities are diffused, implanted, or otherwise introduced into semiconductor wafer 14 through front surface 12 thereof during the processing of integrated circuit 10 to form various transistors and other electrical components within integrated circuit 10. Such electrical components are interconnected with each other by one or more metallization layers (not shown) formed upon front surface 12 of semiconductor wafer 14.

Integrated circuit 10 includes a series of input, output, and power terminals which must be electrically connected to the outside world in order to make practical use of integrated circuit 10. For this purpose, most integrated circuits are provided with a series of conductive bond pads, such as those designated by reference numerals 18 and 20 within FIGS. 1 and 2, formed upon the front surface of semiconductor wafer 14 for making electrical interconnections to integrated circuit 10. As indicated within FIG. 1, these conductive bond pads 18 and 20 are typically formed and disposed proximate the outer perimeter 21 of the semiconductor die containing integrated circuit 10. Integrated circuit 10 also typically includes a wafer passivation layer 22 applied over the front surface of semiconductor wafer 14, as shown in FIG. 2, in order to protect the upper metal interconnect layer of integrated circuit 10. As indicated in FIG. 2, openings are typically provided in wafer passivation layer above conductive bond pads 18/20 to allow access thereto. The structure and steps described thus far are typical of common integrated circuits, whether such integrated circuits are ultimately wire bonded to a package or solder bumped.

As indicated above, the present invention uses ductile solder balls to interconnect chip scale package 8 with external circuitry. In preparation for solder bumping, a first passivation layer 24 is optionally applied over the front surface of semiconductor wafer 14 immediately above wafer passivation layer 22. This first passivation layer 24 is a dielectric and serves to passivate and planarize the wafer surface, and may be omitted in some instances, depending upon the characteristics of existing wafer passivation layer 22. In the preferred embodiment of the present invention, first passivation layer 24 is formed of Benzocyclobutene commercially available from Dow Chemical Company of Midland, Mich. under the commercial designation "Cyclotene". However, other compositions may be used to form first passivation layer 24, including polyimides, polyolefins and other organic and inorganic passivations. First passivation layer 24 is preferably applied over semiconductor wafer 14 by spin coating to form a layer approximately 4–5 $\mu$m thick. Conventional photolithography techniques are used to form patterned openings within first passivation layer 24 above each of the conductive bond pads 18/20 and at those locations at which solder bump pads will ultimately be formed; alternatively, such openings can be limited to the areas above each of the conductive bond pads 18/20, in which case the solder bump pads will ultimately lie above first passivation layer 24.

As indicated above, chip scale package 8 utilizes ductile solder balls that are of somewhat larger dimension than have been used in the past. In order to accommodate such larger solder balls, it is required to relocate, or redistribute, the solder bump pads relative to their corresponding conductive bond pads. As shown in FIGS. 1 and 2, solder bump pad 26, to which ductile solder ball 28 is attached, is laterally displaced from conductive bond pad 18. As further indicated in FIGS. 1 and 2, solder bump pad 26 and conductive bond pad 18 are electrically interconnected by redistribution trace 30.

Redistribution trace 30 and solder bump pad 26 are provided as a patterned metal layer formed over the wafer passivation layer 22 and over first passivation layer 24, above the front surface of semiconductor wafer 14. This patterned metal layer is preferably formed by first blanketing the front surface of semiconductor wafer 14 with a so-called Under Bump Metallurgy (or UBM) layer. Preferably, this UBM layer is a triple-metal stack structure of Aluminum (Al), Nickel Vanadium (NiV), and Copper (Cu); alternatively, the UBM layer could be a triple-metal stack structure of Titanium (Ti), Nickel Vanadium (NiV), and Copper (Cu) or other suitable metal structure. The UBM layer can be applied over semiconductor wafer 14 by known metal sputtering techniques. Preferably, the thickness of such applied UBM layer is approximately 2 microns. The UBM layer serves several purposes; first, it adheres to the underlying surfaces. Secondly, it acts as a solder diffusion barrier for preventing molten solder from passing into the front surface of semiconductor wafer 14. The UBM layer also serves as a "wettable" layer for solderability purposes; finally, the UBM layer serves to minimize electrical contact resistance between the ductile solder ball 28 and the conductive bond pad 18. Following application of such UBM layer, it is etched in accordance with known photolithographic techniques to provide the desired patterned metal layer, thereby providing solder bump pad 26, redistribution trace 30, as well as the electrical contact 32 to conductive bond pad 18.

Those skilled in the art will appreciate that UBM layer described above accomplishes a redistribution of the typical conductive bond pads to a new pattern, such as the array redistribution pattern shown in FIG. 1. The redistribution process described above for relocating the solder bump pads utilizes the same metallurgy for both the redistribution traces (30) as well as the UBM interface (26) to the solder ball 28. The redistributed solder bump pads 26 can be located virtually anywhere on the surface of the device. Typically, the solder bump pads (26) are disposed at a point closer to the center of integrated circuit 10 than the corresponding conductive bond pads (18) to which each such solder bump pad is electrically coupled.

After the UBM layer is applied and patterned in the manner described above, a second passivation layer 33 is applied over such patterned metal layer, as illustrated in FIG. 2. This second passivation layer is also preferably formed of Benzocyclobutene as described above, though polyimides, polyolefins and other organic and inorganic passivations may also be used. Second passivation layer 33 is preferably applied over semiconductor wafer 14 by spin coating to form a layer approximately 4 microns thick. Conventional photolithography techniques are used to form patterned openings within second passivation layer 33 at the site of each of the solder bump pads (26).

Once the second passivation layer 32 is patterned, a ductile solder ball, like solder ball 28 in FIG. 2, is formed upon each of the exposed solder pads 22. Each of such ductile solder balls has a generally spherical shape and measures at least 9 mils (0.009 inch), or at least 229 microns, in diameter. Conventional solder bumping forms solder bumps from 63 Sn/Pb solder or 95 Pb/Sn, but of a size that is less than 0.007 inch in diameter due to process limitations. In contrast, solder ball 28 is formed of a more ductile composition. The preferred composition of solder ball 28 is at least 80 percent lead (Pb) by weight, with the remainder consisting of tin. Alternatively, solder ball 28 can be formed of an alloy of Indium (In) or other Pb alloys having at least 80 percent Pb by weight for increased ductility. The larger diameter and increased ductility of such solder balls makes such solder balls more resistant to fatigue imposed by differing rates of thermal expansion as between the chip scale package 8 and the substrate to which it is ultimately mounted, thereby eliminating the need for the addition of any underfill material. In practicing the preferred embodiment of the present invention, solder ball 28 is pre-formed and is mechanically placed upon solder pad 26. Prior to such mechanical placement, solder flux is applied over the solder bump pads to enhance the joint ultimately formed between solder ball 28 and solder bump pad 26. The mechanical placement of the solder balls upon their respective solder bump pads is accomplished by a mechanical mask through which the solder balls are located. However, the ductile solder balls can be formed by a variety of other methods, including plating, solder paste, evaporation, ball bumping, and solder jetting. Once the solder balls are formed upon the solder bump pads, semiconductor wafer chip scale package 8 is heated to the reflow temperature of solder ball 28, thereby forming a secure attachment of solder ball 28 to solder bump pad 26.

Referring to FIG. 2, the back side, or rear surface, of semiconductor wafer 14 is designated by reference numeral 16. In practicing the preferred embodiment of the present invention, an organic protective coating 34 is coated onto rear surface 16 of semiconductor wafer 14. This protective coating 34 can be spun onto the back side of semiconductor wafer 14 using known spin coat wafer processing equipment, and thereafter cured. Organic protective coating 34 is preferably an epoxy or other suitable organic protective coating that provides mechanical protection to the back side of the die during handling. Protective coating 34 is normally diced through as part of the wafer dicing process; alternatively, protective coating 34 can be photo-imaged to provide a kerf to dice through. In either case, the final dimensions of protective coating 34 are the same as the final dimensions of the die, thereby providing a chip scale packaged device with a minimal form factor. While protective coating 34 can be applied at different stages in the formation of the chip scale package, protective coating 34 is preferably applied before first passivation layer 24 is applied to the front surface of semiconductor wafer 14.

Figure 3:
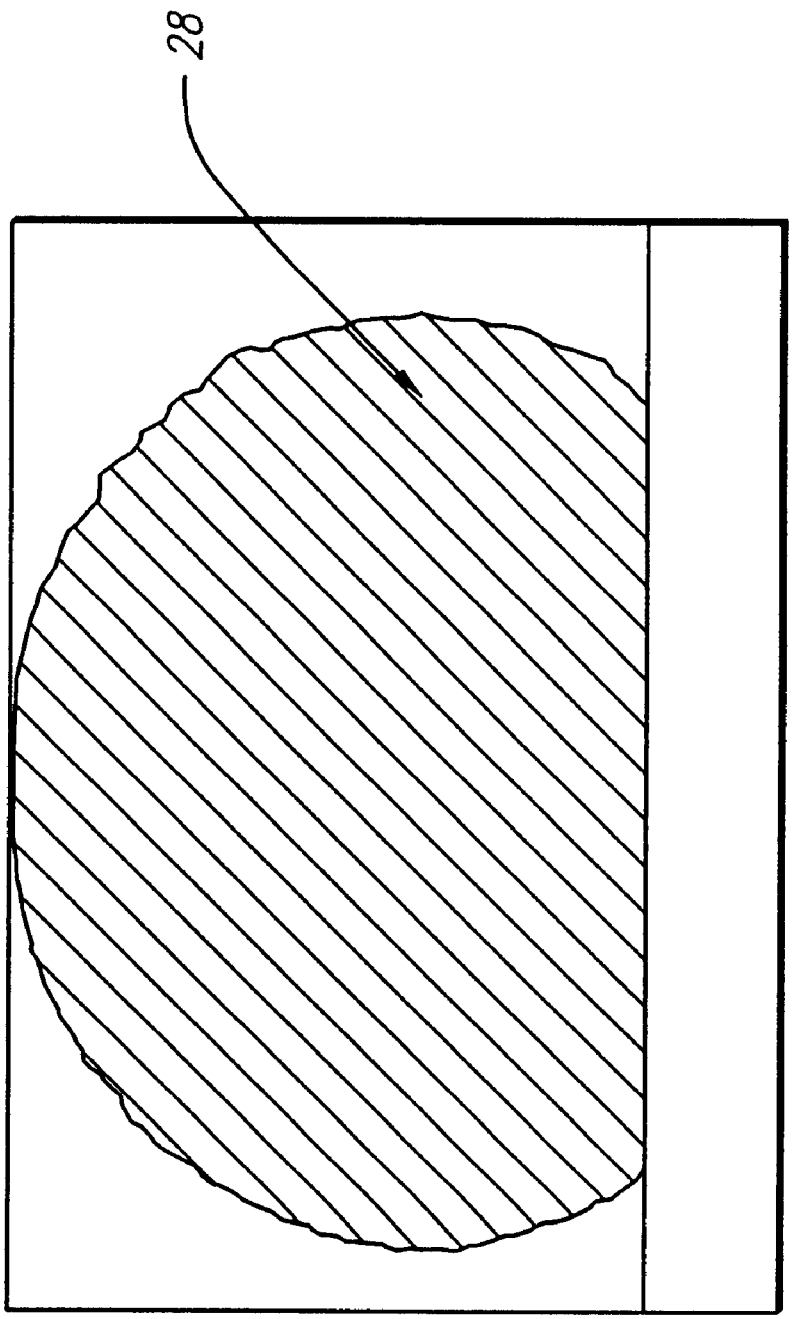
FIG. 3 is a cross-sectional view of a ductile solder ball following heating of the semiconductor wafer to permanently secure the ductile solder ball to an underlying solder bond pad.

FIG. 3 is a cross-sectional representation, obtained via an electron scanning microscope, of the solder bump structure following heating of ductile solder ball 28 to its reflow temperature. While solder ball 28 flattens somewhat during reflow, the height of ductile solder ball 28 is still 8.7 mils (0.0087) inch or greater. This increased height and ductility, when compared with standard solder bump processing, avoids the need for underfill operations, yet resists cracking due to the stresses imposed by differing rates of thermal expansion as between the chip scale package and the substrate to which it is mounted.

As noted above, the present invention also relates to the method of forming the above-described flip chip package for an integrated circuit. In practicing such method, a semiconductor wafer 14 is provided containing a plurality of like integrated circuits (10). Each integrated circuit 10 includes a series of conductive bond pads (18/20) formed upon the front surface 12, at least some of which lie proximate the outer perimeter of the semiconductor wafer, for making electrical interconnections thereto. A protective coating 34 is applied over the rear surface 16 of the semiconductor wafer. A layer of metal (26/30/32) is applied over the front surface 12 of the semiconductor wafer, and portions of such metal layer are thereafter selectively removed to provide a patterned metal layer providing a series of solder bump pads (26) upon the front surface 12 of each such integrated circuit (10). The patterned metal layer (30) electrically couples the conductive bond pads (18/20) of each integrated circuit (10) to their associated solder bump pads (22). Typically, the majority of the conductive bond pads (18/20) are disposed near the outer periphery of the integrated circuit 10, and the step of patterning the metal layer preferably includes the step of disposing the plurality of solder bump pads (26) closer to the center of integrated circuit 10 than the corresponding conductive bond pad (18) to which each such solder bump pad is electrically coupled. Thus, the step of selectively removing portions of the applied metal layer preferably includes the step of forming a series of redistribution traces (30) for electrically coupling each solder bump pad (26) to the corresponding conductive bond pad (18). Ideally, the solder bump pads (26) and the redistribution traces (30) are formed as a single patterned metal layer.

A passivation layer 24 is then applied over the front surface (12/22) of the semiconductor wafer 14 and above each of the patterned metal layers (26/30/32). This passivation layer is a polymer layer, preferably consisting of the polymer Benzocyclobutene. Openings are then formed in the applied passivation layer 24 above each of the solder bump pads 26.

A ductile solder ball 28 is formed upon each solder bump pad 26; each such ductile solder ball has a generally spherical shape and measures approximately .009 inch in diameter or greater. In the preferred embodiment of the process, the ductile solder balls consist of at least 80 percent lead (Pb) by weight to provide the desired degree of ductility. Alternatively, such ductile solder balls may consist of an alloy of Indium (In). Preferably, such ductile solder balls are formed upon each solder bump pad by mechanical placement of a pre-formed solder ball on each such solder bump pad. The ductile solder balls (28) have a characteristic reflow temperature at which they become molten. The preferred process includes the step of of applying solder flux to the solder bump pads (26) prior to application of the ductile solder balls (28), and thereafter heating semiconductor wafer 14 to the reflow temperature of such solder balls after application of the ductile solder balls to permanently secure such ductile solder balls to their respective solder bump pads.

All of the processing steps used to practice the present invention are performed at the wafer level, i.e., before the semiconductor wafer is diced to form individual integrated circuits/chip scale packages. At this stage, semiconductor wafer 14 is then diced in accordance with conventional scribing/breaking methods to provide a number of chip scale packaged integrated circuits ready to be mounted to a circuit board or other patterned substrate.

Those skilled in the art will now appreciate that an improved chip scale package for a flip chip integrated circuit, and method for providing such a chip scale package, has been described. The flip chip scale package method described herein is a wafer-level process that can be performed before individual integrated circuits are scribed and cut from a semiconductor wafer, thereby reducing cost. No bare die handling is required at any step in the process, which is a significant advantage over the above-described PMEB package from Mitsubishi. The large ductile solder bumps greatly reduce the likelihood of fatigue induced by differing coefficients of thermal expansion as between the flip chip integrated circuit and the substrate to which it is soldered, thereby eliminating the need for, and associated expense of, including an underfill operation.. The process of coating the backside of the wafer makes the integrated circuit easier to handle and provides additional mechanical protection. In contrast, the Mini BGA process by Sandia does not provide any additional packaging to the integrated circuit.

In addition, the ability to use the same patterned metal layer to form both the solder bump pads as well as the redistribution traces that relocate such solder bump pads minimizes the number of processing steps and reduces the cost of manufacture. In contrast, the aforementioned Mini BGA solder bump technology from Sandia requires that a plating process be used to apply solder bumps, and therefore requires the use of two metallization layers to accomplish redistribution of the solder bump pad locations. Moreover, the size of the solder bumps provided using the Mini BGA technology is not as large as can be obtained by mechanically placing solder balls on their respective solder pads.

While the present invention has been described with respect to a preferred embodiment thereof, such description is for illustrative purposes only, and is not to be construed as limiting the scope of the invention. For example, while the preferred embodiment of the present invention uses highly ductile solder balls having a high lead content, it is possible to use solder balls of conventional eutectic tin/lead (63 Sn/Pb); the larger diameter of the solder balls made in accordance with the present invention increases the resistance of such solder balls to fatigue and may be sufficient to avoid the need for underfill even though such solder balls are made of conventional eutectic tin/lead. Various modifications and changes may be made to the described embodiments by those skilled in the art without departing from the true spirit and scope of the invention as defined by the appended claims.

We claim:

1. A method of forming a flip chip package for an integrated circuit including the steps of:

a. providing a semiconductor wafer containing a plurality of like integrated circuits, the semiconductor wafer having a front surface and an opposing rear surface, each of said integrated circuits including a plurality of conductive bond pads formed upon the front surface of the semiconductor wafer for making electrical interconnections to each such integrated circuit;

b. applying a layer of metal over the front surface of the semiconductor wafer;

c. selectively removing portions of the applied metal layer over each of said integrated circuits to provide a patterned metal layer over each integrated circuit, each of such patterned metal layers providing a plurality of solder bump pads upon the front surface of each such integrated circuit, and each such patterned metal layer electrically coupling the conductive bond pads of each such integrated circuit to the solder bump pads of each such integrated circuit;

d. applying a passivation layer over the front surface of the semiconductor wafer and above each of the patterned metal layers;

e. forming openings in the applied passivation layer above each of the solder bump pads;

f. applying ductile solder balls above each solder bump pad, each of said ductile solder balls having a generally spherical shape and measuring at least 9 mils (0.009 inch) in diameter, wherein the ductile solder balls have a characteristic reflow temperature at which they become molten;

g. applying solder flux to the solder bump pads prior to application of the ductile solder balls;

h. and thereafter heating the semiconductor wafer to the characteristic reflow temperature of such ductile solder balls after application of the solder flux and ductile solder balls to permanently secure such ductile solder balls to the solder bump pads; and i. dicing the semiconductor wafer following step h. to provide the plurality of integrated circuits in chip scale packaged form.

2. A method of forming a flip chip package for an integrated circuit, including the steps of:

a. providing a semiconductor wafer containing a plurality of like integrated circuits, the semiconductor wafer having a front surface and an opposing rear surface, each of said integrated circuits including a plurality of conductive bond pads formed upon the front surface of the semiconductor wafer for making electrical interconnections to each such integrated circuit;

b. applying a layer of metal over the front surface of the semiconductor wafer;

c. selectively removing portions of the applied metal layer over each of said integrated circuits to provide a patterned metal layer over each integrated circuit, each of such patterned metal layers providing a plurality of solder bump pads upon the front surface of each such integrated circuit, and each such patterned metal layer electrically coupling the conductive bond pads of each such integrated circuit to the solder bump pads of each such integrated circuit;

d. applying a passivation layer over the front surface of the semiconductor wafer and above each of the patterned metal layers;

e. forming openings in the applied passivation layer above each of the solder bump pads;

f. applying ductile solder balls above each solder bump pad, each of said ductile solder balls having a generally spherical shape and measuring at least 9 mils (0.009 inch) in diameter, wherein the step of applying a ductile solder ball to each solder bump pad includes the step of mechanically placing a pre-formed solder ball on each such solder bump pad;

g. heating the semiconductor wafer to the characteristic reflow temperature of the ductile solder ball following step f. to permanently secure such ductile solder ball directly to its respective solder bump pad; and h. dicing the semiconductor wafer following step g. to provide the plurality of integrated circuits in chip scale packaged form.

* * * * *